(12) United States Patent
Yoon et al.

(10) Patent No.: US 11,587,608 B2
(45) Date of Patent: Feb. 21, 2023

(54) VOLATILE MEMORY DEVICE, STORAGE DEVICE, AND OPERATING METHOD OF DECREASING A LEAKAGE CURRENT

(71) Applicant: SK hynix Inc., Icheon-si (KR)

(72) Inventors: Hyun Ju Yoon, Icheon-si (KR); Min Kang, Icheon-si (KR); Dong Uc Ko, Icheon-si (KR); Dong Keun Kim, Icheon-si (KR); Young Su Oh, Icheon-si (KR); Jun Hyun Chun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/337,231

(22) Filed: Jun. 2, 2021

(65) Prior Publication Data

US 2022/0165325 A1 May 26, 2022

(30) Foreign Application Priority Data

Nov. 20, 2020 (KR) .......................... 10-2020-0157128

(51) Int. Cl.
| | |
|---|---|
| *G11C 8/10* | (2006.01) |
| *G11C 11/408* | (2006.01) |
| *G11C 11/4094* | (2006.01) |
| *G11C 11/4076* | (2006.01) |
| *G11C 11/4091* | (2006.01) |

(52) U.S. Cl.
CPC ............ *G11C 11/4087* (2013.01); *G11C 8/10* (2013.01); *G11C 11/4076* (2013.01); *G11C 11/4085* (2013.01); *G11C 11/4091* (2013.01); *G11C 11/4094* (2013.01); *G11C 11/4082* (2013.01)

(58) Field of Classification Search
CPC ............ G11C 11/4087; G11C 11/4085; G11C 11/4094; G11C 11/4076; G11C 11/4091
See application file for complete search history.

(56) References Cited

U.S. PATENT DOCUMENTS 5,835,433 A * 11/1998 Casper ................ G11C 11/4091
365/207
6,115,319 A * 9/2000 Kinoshita ................ G11C 8/08
365/189.11

(Continued)

FOREIGN PATENT DOCUMENTS

| KR | 20200004002 A | 1/2020 |
|---|---|---|
| KR | 102111738 B1 | 5/2020 |

*Primary Examiner* — Mushfique Siddique
(74) *Attorney, Agent, or Firm* — Perkins Coie LLP

(57) ABSTRACT

There are provided a volatile memory device, and an operating method. The volatile memory device includes: a plurality of memory cells arranged in rows and columns and structured to store data; word lines; bit lines; a row decoder; a column decoder; and a control logic coupled to communicate with the row and column decoders and configured to, in an active period, provide the row decoder with a first command, and provide the column decoder with a second command, wherein the row decoder is further configured to: apply a first word line voltage higher than a ground voltage to a selected word line, from when the first command is provided; and for a duration over which the row decoder is activated, apply either a second word line voltage lower than the first word line voltage to the selected word line or no voltage to the selected word line.

17 Claims, 12 Drawing Sheets

(56) References Cited

U.S. PATENT DOCUMENTS

| | | | | |
|---|---|---|---|---|
| 7,440,347 | B1* | 10/2008 | Vogelsang | G11C 29/83 365/201 |
| 10,861,537 | B1* | 12/2020 | Lien | G11C 16/32 |
| 2003/0227041 | A1* | 12/2003 | Atwood | H01L 27/1203 257/908 |
| 2020/0013451 | A1* | 1/2020 | Son | G11C 7/1048 |
| 2020/0152256 | A1* | 5/2020 | Seo | G11C 7/222 |
| 2021/0027821 | A1* | 1/2021 | Kawamura | G11C 5/063 |

* cited by examiner

– Prior Art –

– Prior Art –

– Prior Art –

- Prior Art -

- Prior Art -

– Prior Art –

- Prior Art -

– Prior Art –

VOLATILE MEMORY DEVICE, STORAGE DEVICE, AND OPERATING METHOD OF DECREASING A LEAKAGE CURRENT

CROSS-REFERENCE TO RELATED APPLICATION

This patent document claims priority to and benefits of the Korean patent application number 10-2020-0157128, filed Nov. 20, 2020, which is incorporated herein by reference in its entirety.

TECHNICAL FIELD

The technology and implementations disclosed in this patent document generally relates to an electronic device, and more particularly, to a volatile memory device, a storage, and an operating method of a volatile memory device.

BACKGROUND

Storage devices refer to electronic components that are configured to store data on a permanent or temporary basis. Each storage device may include one or more storage medium to store data and operate based on a request from a host. The storage device may include a storage medium for storing data and may further include a memory controller for controlling the storage medium to store or retrieve data. The memory device used as a storage medium is classified into a volatile memory device and a nonvolatile memory device.

A volatile memory device may store data only when power is supplied. Thus, such a volatile memory device loses its data in the absence of power. The examples of the volatile memory device include a Static Random Access Memory (SRAM) or a Dynamic Random Access Memory (DRAM).

A nonvolatile memory device can retain its data in the absence of power. The nonvolatile memory device may include a Read Only Memory (ROM), a Programmable ROM (PROM), an Electrically Programmable ROM (EPROM), an Electrically Erasable ROM (EEROM), or a flash memory. The storage devices can store read data provided from the nonvolatile memory device in the volatile memory device. The storage devices can provide the host data temporarily stored in the volatile memory device.

SUMMARY

Embodiments provide a volatile memory device, a storage device, and an operating method of a volatile memory device, which can decrease a leakage current generated in a cell capacitor and reduce IDD3N as an active standby current.

In accordance with an aspect of the disclosed technology, there is provided a volatile memory device including: a plurality of memory cells arranged in rows and columns and structured to store data; word lines coupled to the memory cells, each word line being in a row direction and coupled to memory cells in a row; bit lines coupled to the memory cells, each bit line being in a column direction and coupled to memory cells in a column; a row decoder coupled to the word lines and configured to select a word line connected to some of the plurality of memory cells; a column decoder coupled to the bit lines and configured to select a first bit line group of the bit lines that are connected to row of first memory cells in which data is to be stored and a second bit line group of the bit lines that are connected to second memory cells in which data has been already stored; and a control logic coupled to communicate with the row and column decoders and configured to, in an active period, provide the row decoder with a first command for instructing the volatile memory device to activate the row decoder, and provide the column decoder with a second command for instructing the volatile memory device to perform an operation on the some of the plurality of memory cells, wherein the row decoder is further configured to: apply a first word line voltage higher than a ground voltage to a selected word line, from when the first command is provided to when the row decoder is activated; and for a duration over which the row decoder is activated, apply either a second word line voltage lower than the first word line voltage to the selected word line or no voltage to the selected word line.

In accordance with another aspect of the disclosed technology, there is provided a storage device including: a volatile memory device configured to temporarily store data; and a memory controller in communication with the volatile memory device and configured to provide data, an address, and a command to the volatile memory device, wherein the volatile memory device includes: a plurality of memory cells; a row decoder configured to select a word line connected to some of the plurality of memory cells; a column decoder configured to select a first bit line group connected to a first memory cell in which data is to be stored and a second bit line group connected to a second memory cell in which data has been already stored; and a control logic configured to, in an active period, provides the row decoder with a first command for instructing the volatile memory device to activate the row decoder, and provide the column decoder with a second command for instructing the volatile memory device to perform an operation on the some of the plurality of memory cells, and wherein the row decoder is further configured to: apply, during a first period of time, a first word line voltage higher than a ground voltage to a selected word line, the first period of time starts from when the first command is provided and ends when the row decoder is activated; and apply, during a second period of time, a second word line voltage lower than the first word line voltage to the selected word line, the second period of time starts from an end of the first period of time and ends when the active period ends.

In accordance with still another aspect of the disclosed technology, there is provided a method for operating a volatile memory device. The method includes: applying, during a first period of time in an active period, a first word line voltage higher than a ground voltage to a selected word line that is selected among a plurality of word lines coupled to memory cells included in the volatile memory device, the first period of time starting from an issuance of a first command to activate a row decoder and ending when the row decoder is activated; and applying, during a second period of time in the active period, a second word line voltage lower than the first voltage level to the selected word line, the second period of time starting from an end of the first period of time applying, in a precharge period that is after the active period, the first word line voltage to the selected word line; and applying, in the precharge period, a third word line voltage equal to the ground voltage to the selected word line.

BRIEF DESCRIPTION OF THE DRAWINGS

Example embodiments will now be described with reference to the accompanying drawings.

DETAILED DESCRIPTION

The specific structural or functional description disclosed herein is merely illustrative for the purpose of describing embodiments according to the concept of the disclosed technology. The embodiments of the disclosed technology can be implemented in various forms, and cannot be construed as limited to the embodiments set forth herein.

Figure 1:
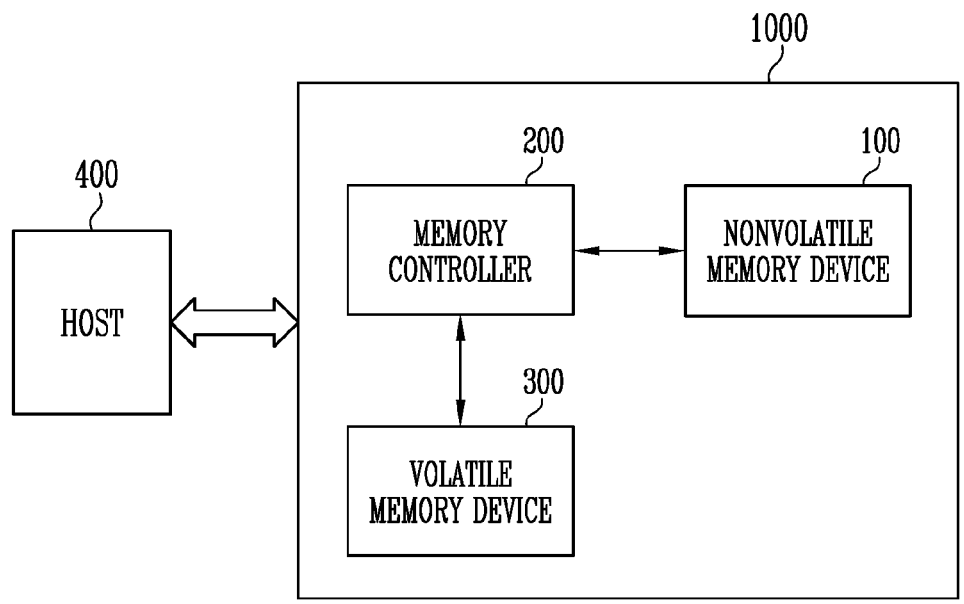
FIG. 1 is a diagram illustrating a storage system in accordance with an embodiment of the disclosed technology.

FIG. 1 is a diagram illustrating a storage system in accordance with an embodiment of the disclosed technology.

Referring to FIG. 1, the storage system may be implemented as a personal computer (PC), a data center, an enterprise type data storage system, a date processing system including a direct attached storage (DAS), or a data processing system including a storage area network (SAN), a data processing system including a network attached storage, or the like.

The storage system may include a storage device 1000 and a host 400.

The storage device 1000 may storing data based on a request of the host 400, such as a mobile phone, a smart phone, an MP3 player, a laptop computer, a desktop computer, a game console, a TV, a tablet PC, or an in-vehicle infotainment system.

The storage device 1000 may be manufactured as any one of various types of storage devices according to a host interface that is a communication interface between the host 400 and the storage device 1000. For example, the storage device 1000 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, or others.

The storage device 1000 may be manufactured as any one of various kinds of package types. For example, the storage device 1000 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The storage device 1000 may include a nonvolatile memory device 100, a memory controller 200, and a volatile memory device 300.

The nonvolatile memory device 100 may operate based on the control of the memory controller 200. Specifically, the nonvolatile memory device 100 may receive a command and an address from the memory controller 200, and access a memory cell selected by the address among memory cells (not shown). The nonvolatile memory device 100 may perform an operation corresponding to the command on the memory cell selected by the address.

The command may include, for example, a program command, a read command, and/or an erase command, and a program operation (or write operation), a read operation, and an erase operation may be performed corresponding to the program command, the read command, and the erase command, respectively.

The program operation may be an operation in which the nonvolatile memory device 100 stores data provided from the host 400 based on the control of the memory controller 200.

For example, the nonvolatile memory device 100 may receive a program command, an address, and data, and program the data in a memory cell selected by the address. The data to be programmed in the selected memory cell may be defined as write data.

The read operation may be an operation in which the nonvolatile memory device 100 reads read data stored in the nonvolatile memory device 100 under the control of the memory controller 200.

For example, the nonvolatile memory device 100 may receive a read command and an address, and read data from an area selected by the address in a memory cell array (not shown). The data to be read from the selected area among data stored in the nonvolatile memory device 100 may be defined as read data.

The erase operation may be an operation in which the nonvolatile memory device 100 erases data stored in the nonvolatile memory device 100 under the control of the memory controller 200.

For example, the nonvolatile memory device 100 may receive an erase command and an address, and erase data stored in an area selected by the address.

In some implementations, the nonvolatile memory device 100 may be implemented as any one of a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or a flash memory.

For example, the flash memory may include a NAND flash memory, a vertical NAND flash memory, a NOR flash memory, or others.

In this patent document, some implementations may be explained assuming that the nonvolatile memory device 100 is a NAND flash memory but other implementations are also possible.

The memory controller 200 can access the nonvolatile memory device 100 based on requests from the user/host by providing command/address signals to the nonvolatile memory device 100. In some implementations, the nonvolatile memory device 100 may store write data based on the control of the memory controller 200, or read stored data and provide the read data to the memory controller 200.

The nonvolatile memory device 100 may include a plurality of dies. One die may include at least one plane. One plane may include a memory cell array (not shown) including memory cells for storing data.

The memory cell array may include a plurality of memory blocks (not shown). In some implementations, the memory block may be a unit for performing an erase operation of erasing data.

The memory block may include a plurality pages (not shown), each page corresponds to a plurality of memory cells. In some implementations, read and program (write) operations are performed on a page basis.

The memory block may include a plurality of memory cells. Each memory cell may have a target state that is an erase state or any one state among a plurality of program states based on an operation to be performed on a corresponding memory cell.

In some implementations, a memory cell may have a target state that is an erase state or any one state among a plurality of program states based on data to be stored in the corresponding memory cell.

The memory controller 200 may control overall operations of the storage device 1000.

When power is applied to the storage device 1000, the memory controller 200 may execute firmware. When the nonvolatile memory device 100 is a flash memory device, the firmware may include at least one of a host interface layer, a flash translation layer, or a flash interface layer.

The host interface layer may control an operation between the host 400 and the memory controller 200.

The flash translation layer may translate a logical address provided from the host 400 into a physical address.

The flash interface layer may control communication between the memory controller 200 and the nonvolatile memory device 100.

The memory controller 200 may control the nonvolatile memory device 100 to perform a program operation, a read operation, and an erase operation respectively in response to a write request, a read request, and an erase request of the host 400.

In the program operation, the memory controller 200 may provide the nonvolatile memory device 100 with a program command, a physical address, and write data.

In the read operation, the memory controller 200 may provide the nonvolatile memory device 100 with a read command and a physical address.

In the erase operation, the memory controller 200 may provide the nonvolatile memory device 100 with an erase command and a physical address.

The memory controller 200 may autonomously generate a command, an address, and data regardless of any request provided from the host 400. The memory controller 200 may transmit the command, the address, and the data, which are autonomously generated, to the nonvolatile memory device 100.

For example, the memory controller 200 may generate a command for performing a background operation, an address, and data. Also, the memory controller 200 may provide the nonvolatile memory device 100 with the command, the address, and the data.

The background operation may be at least one of wear leveling, read reclaim, or garbage collection.

The wear leveling maybe, for example, a static wear leveling, a dynamic wear leveling, or others. The static wear leveling may store a number of times memory blocks are erased, and moving cold data in which an erase operation or a write operation hardly occurs to a memory block which is erased a largest number of times. The dynamic wear leveling may mean an operation of storing a number of times memory blocks are erased, and programming data in a memory block which is erased a smallest number of times.

The read reclaim may mean an operation of moving data stored in a memory block to another memory block before an uncorrectable error occurs in the data stored in the memory block.

The garbage collection may mean an operation of copying valid data included in a bad block among memory blocks to a free block, and erasing invalid data included in the bad block. That the valid data included in the bad block is copied to the free block may mean that the valid data included in the bad block is moved to the free block.

The memory controller 200 may control two or more nonvolatile memory devices 100. The memory controller 200 may control the nonvolatile memory devices 100 according to an interleaving technique so as to improve operational performance.

The interleaving technique may be a technique for controlling operations on the two or more nonvolatile memory devices 100 to overlap with each other.

The memory controller 200 may provide an interface between the host 400 and the volatile memory device 300.

In an embodiment, the memory controller 200 may store data provided from the host 400 in the volatile memory device 300. Also, the memory controller 200 may store read data provided from the nonvolatile memory device 100 in the volatile memory device 300. For example, the memory controller 200 may provide the volatile memory device 300 with a write command instructing the volatile memory device 300 to store data provided from the host 400 or the nonvolatile memory device 100, an address, and data.

In an embodiment, the memory controller 200 may provide the host 400 with data temporarily stored in the volatile memory device 300. The memory controller 200 may provide the volatile memory device 300 with a read command instructing the volatile memory device 300 to read data, and an address.

The volatile memory device 300 may temporarily store data. Specifically, the volatile memory device 300 may store data only while power of an external power source is supplied. When the supply of power is suspended, the data stored in the volatile memory device 300 may disappear.

In an embodiment, the volatile memory device 300 may not be included in the memory controller 200 as shown in FIG. 1. However, the disclosed technology is not limited thereto, and the volatile memory device 300 may be included in the memory controller 200.

Exemplarily, the volatile memory device 300 may be implemented as any one of a Double Data Rate Synchronous Dynamic Random Access Memory (DDR SDRAM), a Low Power Double Data Rate 4 (LPDDR4) SDRAM, a Graphics Double Data Rate (GDDR) SDRAM, a Low Power DDR (LPDDR), or a Rambus Dynamic Random Access Memory (RDRAM).

In the volatile memory device 300, a predefined current is provided based on a command. In the example of a DDR2 SDRAM, IDD0, IDD1, IDD2P, IDD2Q, IDD2N, IDD3P, IDD3N, IDD4W, IDD4R, IDD5B, IDD6, IDD7, or others may be set. The IDD0 is an active precharge current for operating one bank. The IDD1 is an active-read-precharge current for operating one bank. The IDD2P is a precharge power-down current (all banks idle). The IDD2Q is a precharge quiet standby current (all banks idle). The IDD2N is a precharge standby current (all banks idle). The IDD3P is an active power-down current (all banks open). The IDD3N is an active standby current (all banks open). The IDD4W is an operating burst write current (all banks open, continuous burst writes). The IDD4R is an operating burst read current (all banks open, continuous burst reads). The IDD5B is a burst auto refresh current. The IDD6 is a self-refresh current. The IDD7 is an operating bank interleave read current (all bank interleaving reads).

The host 400 may communicate with the storage device 1000 through an interface (not shown).

The interface may be implemented as a serial advanced technology attachment (SATA) interface, a SATA express (SATAe) interface, a serial attached small computer system interface (SAS) interface, a peripheral component interconnect express (PCIe) interface, a non-volatile memory express (NVMe) interface, an advanced host controller interface (AHCI), or a multimedia card interface. However, the disclosed technology is not limited thereto.

The host 400 may store write data in the storage device 1000, or communicate with the storage device 1000 to acquire read data stored in the storage device 1000.

In an embodiment, the host 400 may provide the storage device 1000 with a write request for requesting the storage device 1000 to store write data. Also, the host 400 may provide the storage device 1000 with a write request, write data, and a logical address for identifying the write data.

The storage device 1000 may store the write data provided by the host 400 in the nonvolatile memory device 100 and provide the host 400 with a response that the storing of the write data has been completed, in response to the write request provided from the host 400.

In an embodiment, the host 400 may provide the storage device 1000 with a read request for requesting the storage device 1000 to provide data stored in the storage device 1000 to the host 400. Also, the host 400 may provide a read request and a read address to the storage device 1000.

The storage device 1000 may read, from the nonvolatile memory device 100, read data corresponding to the read address provided by the host 400 and provide the host 400 with the read data as a response to the read request, in response to the read request provided from the host 400.

Figure 2:
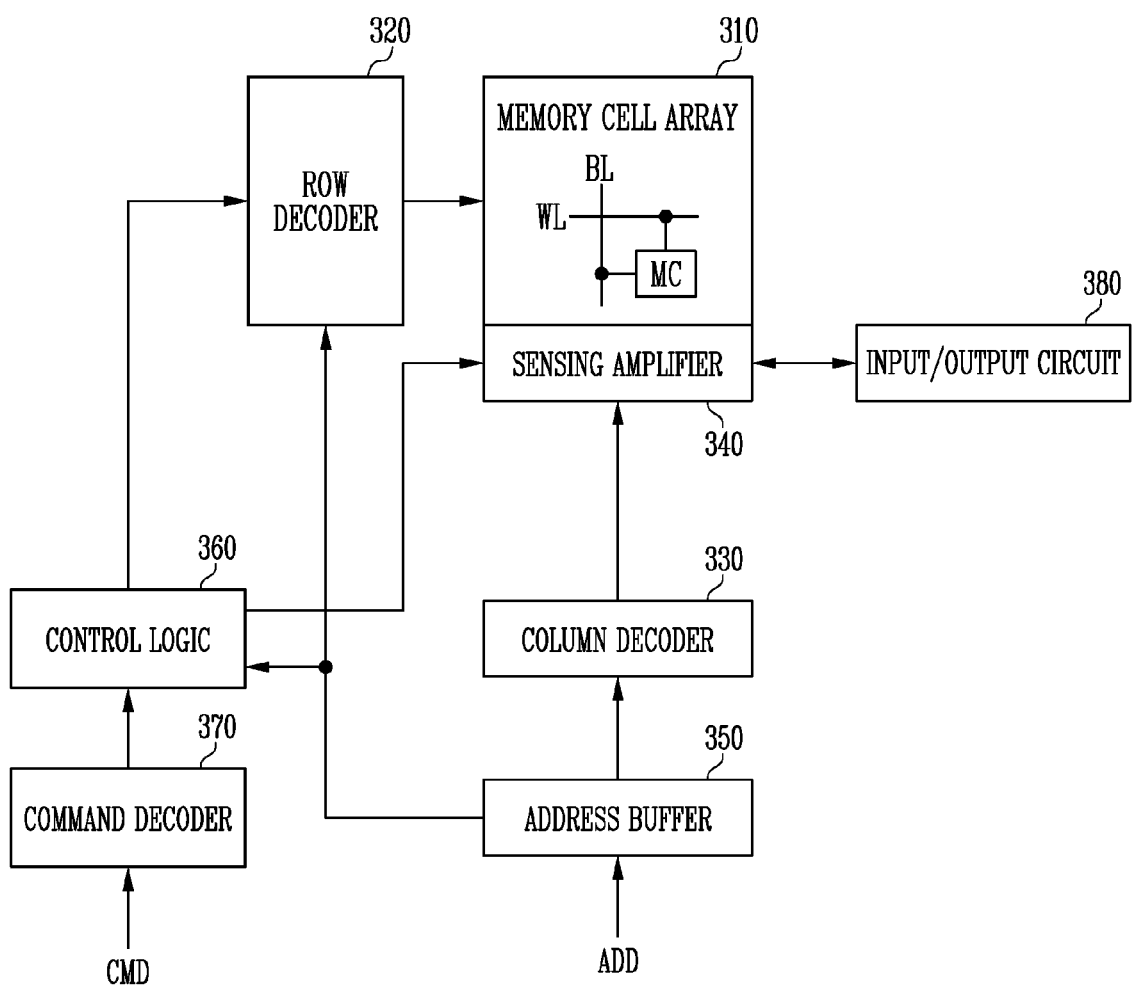
FIG. 2 is a diagram illustrating a volatile memory device in accordance with an embodiment of the disclosed technology.

FIG. 2 is a diagram illustrating a volatile memory device in accordance with an embodiment of the disclosed technology.

Referring to FIG. 2, the volatile memory device 300 may include a memory cell array 310, a row decoder 320, a column decoder 330, a sensing amplifier 340, an address buffer 350, a control logic 360, a command decoder 370, and an input/output circuit 380.

The memory cell array 310 may include a plurality of memory cells MC, a set of word lines (WL's) in the row direction each connecting memory cells in a row of memory cell array 310 and a set of bit lines (BL's) in the column direction each connecting memory cells in a column of memory cells in the array 310. Each of the plurality of memory cells MC may be connected to a corresponding word line WL and a corresponding bit line BL for that cell. As shown in FIG. 2, the WLs and BLs are arranged in row and column directions and the memory cells are located at intersections of the WLs and BLs and are coupled their corresponding WLs and BLs.

The row decoder 320 may select a word line connected to a memory cell to be accessed among the plurality of memory cells MC based on an address ADD input from the memory controller 200. The row decoder 320 may decode a row address in an address ADD output from the address buffer 350, and activate a word line based on the decoded row address. In a self-refresh operation mode, the row decoder 320 may decode a row address generated from an address counter (not shown), and activate a word line based on the decoded row address. The row decoder 320 may apply a word line voltage to the selected word line. In some implementations, the row decoder 320 may not connect the selected word line to the earth ground and instead may "float" the selected word line by applying a voltage to the selected word line under the control of the control logic 360 or by applying no voltage to the selected word line.

The column decoder 330 may select bit lines connected to memory cells to store data among a plurality of bit lines BL based on an address ADD input from the memory controller 200. The bit lines connected to the memory cells in which the data is to be stored may be referred to as a first bit line group. The column decoder 330 may select bit lines connected to memory cells in which data has been already stored among the plurality of bit lines BL based on an address ADD input from the memory controller 200. The bit lines connected to the memory cell in which the data has been already stored may be referred to as a second bit line group. The column decoder 330 may decode a column address in an address ADD output from the address buffer 350, and activate a bit line corresponding to the decoded column address. The column decoder 330 may apply a bit line voltage to the selected bit lines.

The sensing amplifier 340 may sense a voltage difference of a bit line pair based on the distribution of charges stored in a selected memory cell. The sensing amplifier 340 may read data stored in the memory cell array 310 by amplifying the sensed voltage difference. The sensing amplifier 340 may provide data to a memory cell through a selected bit line. Alternatively, the sensing amplifier 340 may sense data stored in the memory cell through the selected bit line. The sensing amplifier 340 may receive data from the input/output circuit 380. Alternatively, the sensing amplifier 340 may output sensed data to the input/output circuit 380. In a refresh operation, the sensing amplifier 340 may provide the data stored in the memory cell. The sensing amplifier 340 may perform the refresh operation on selected memory cells based on the control of the control logic 360. To perform the refresh operation, the sensing amplifier 340 may amplify data of the selected memory cells and provide the amplified data to the selected memory cells. For the purpose of the refresh operation, the sensing amplifier 340 may include N-sensing amplifier (not shown) and a P-sensing amplifier (not shown).

The address buffer 350 may store an address ADD input from the memory controller 200. The address buffer 350 may provide the stored address ADD to the row decoder 320. The address buffer 350 may provide the stored address ADD to the column decoder 330. An address ADD of an external signaling manner may be converted into an address of an internal signaling method of the volatile memory device 300 by the address buffer 350.

The control logic 360 may control an operation of the volatile memory device 300 based on a decoded command signal output from the command decoder 370. The control logic 360 controls a refresh operation of the volatile memory device 300 in response to a command output from the command decoder 370. A refresh command instructing the volatile memory device 300 to perform a normal auto refresh operation may be generated through a combination of control signals or commands CMD provided from the memory controller 200. The refresh operation is determined by the command decoder 370, and the refresh command may be provided to the control logic 360. Then, the control logic 360 may control the row decoder 320 and the sensing amplifier 340 so as to perform the refresh operation on a selected area. The control logic 360 may further include the address counter (not shown) for generating a row address so as to perform the refresh operation.

In an active period in which a write operation or a read operation is performed, the control logic 360 may provide, to the row decoder 320, an active command instructing the volatile memory device 300 to activate the row decoder 320. The control logic 360 may provide, to the column decoder 330, an operation command instructing the volatile memory device 300 to perform the write operation or the read operation on a selected memory cell.

The command decoder 370 may decode a command CMD provided from the memory controller 200. The command decoder 370 may internally generate a decoded command signal and provide the decoded command signal to the control logic 360. In the general volatile memory device 300, an active command and an auto refresh command are determined by commands CMD provided from the memory controller 200.

Data input through the input/output circuit 380 may be written to the memory cell array 310, based on an address ADD. Data read from the memory cell array 310, based on an address ADD, may be output to the outside through the input/output circuit 380.

Although not shown in the drawing, the volatile memory device 300 may further include a mode register setting circuit for setting a mode register in response to a mode register set command for designating an operation mode of the volatile memory device 300 and an address ADD, a clock circuit for generating a clock signal, a power circuit for generating an internal voltage, based on a power voltage applied from the outside, and dividing an internal voltage, and the like.

Figure 3:
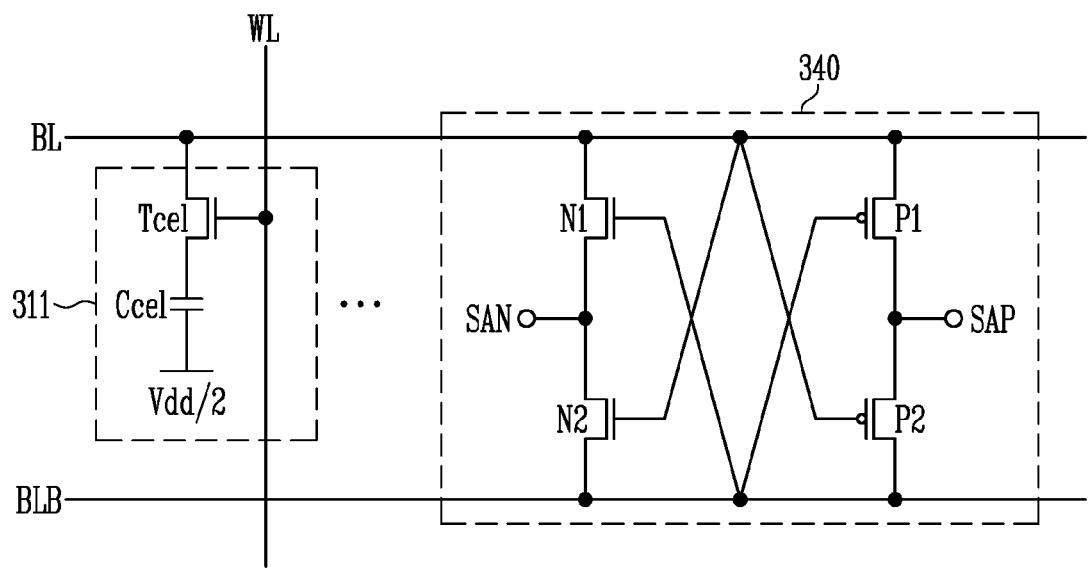
FIG. 3 is a diagram illustrating an embodiment of a memory cell and a sensing amplifier, which are shown in FIG. 2.

FIG. 3 is a diagram illustrating an embodiment of the memory cell and the sensing amplifier, which are shown in FIG. 2.

Referring to FIG. 3, a memory cell 311 shown in FIG. 3 may be any one of the plurality of memory cells MC shown in FIG. 2.

The memory cell 311 may include a cell capacitor Ccel and a cell transistor Tcel.

The cell transistor Tcel may electrically connect a bit line BL and the cell capacitor Ccel. A gate of the cell transistor Tcel may be connected to a word line WL. A first electrode of the cell transistor Tcel may be connected to the bit line BL. A second electrode of the cell transistor Tcel may be connected to the cell capacitor Ccel.

The cell capacitor Ccel may charge charges from a bit line voltage applied to the bit line BL. A first electrode of the cell capacitor Ccel may be connected to the second electrode of the cell transistor Tcel. A second electrode of the cell capacitor Ccel may be connected to a voltage Vdd/2 corresponding to a half of an external voltage Vdd.

A sensing amplifier 340 may sense data stored in the memory cell 311 through the bit line BL or an inverting bit line BLB. The sensing amplifier 340 may include a first NMOS transistor N1, a second NMOS transistor N2, a first PMOS transistor P1, and a second PMOS transistor P2. However, the disclosed technology is not limited thereto, and the sensing amplifier 340 may further include a voltage equalization circuit.

When a voltage is charged in the cell capacitor Ccel, and a voltage level of the bit line BL is the voltage Vdd/2 corresponding to the half of the external voltage Vdd, the voltage level of the bit line BL may become higher by a predetermined voltage than the voltage Vdd/2 corresponding to the half of the external voltage Vdd, when a voltage level of the word line becomes a logic high level. The second NMOS transistor N2 may be turned on, and the second PMOS transistor P2 may be turned off. When a first sensing signal SAN having a logic low level (or 0V as a voltage level of a ground voltage) is applied, the first sensing signal SAN having the logic low level may be applied to the inverting bit line BLB through the second NMOS transistor N2. When the first sensing signal SAN having the logic low level is applied to the inverting bit line BLB, the first NMOS transistor N1 may be turned off, and the first PMOS transistor P1 may be turned on. Subsequently, when a second sensing signal SAP having the logic high level (or a voltage level of the external voltage VDD) is applied, the voltage of the bit line BL may be increased to be equal to that of the second sensing signal SAP. The sensing amplifier 340 senses the voltage level of the bit line BL, to read data stored in the memory cell 311. When the voltage level of the bit line BL is increased, the voltage may be re-charged in the cell capacitor Ccel.

When the voltage in the cell capacitor Ccel is discharged, the voltage level of the bit line BL is the voltage Vdd/2 corresponding to the half of the external voltage Vdd, the voltage level of the bit line BL may become lower by a predetermined voltage than the voltage Vdd/2 corresponding to the half of the external voltage Vdd, when the voltage level of the word line WL becomes the logic high level. The second NMOS transistor N2 may be turned off, and the second PMOS transistor P2 may be turned on. The first sensing signal SAN having the logic low level (or 0V as the voltage level of the ground voltage) may be applied, and then the second sensing signal SAP having the logic high level (or the voltage level of the external voltage Vdd) may be applied. The second sensing signal SAP having the logic high level (or the voltage level of the external voltage Vdd) may be applied to the inverting bit line BLB through the second PMOS transistor P2. When the second sensing signal SAP having the logic high level (or the voltage level of the external voltage Vdd) is applied to the inverting bit line BLB, the first NMOS transistor N1 may be turned on, and the first PMOS transistor P1 may be turned off. Subsequently, the voltage level of the bit line BL may be decreased to be equal to that of the first sensing signal SAN. The sensing amplifier 340 senses the voltage level of the bit line BL, to read data stored in the memory cell 311. When the voltage level of the bit line BL is decreased, the cell capacitor Ccel may maintain a discharge state.

Figure 4:
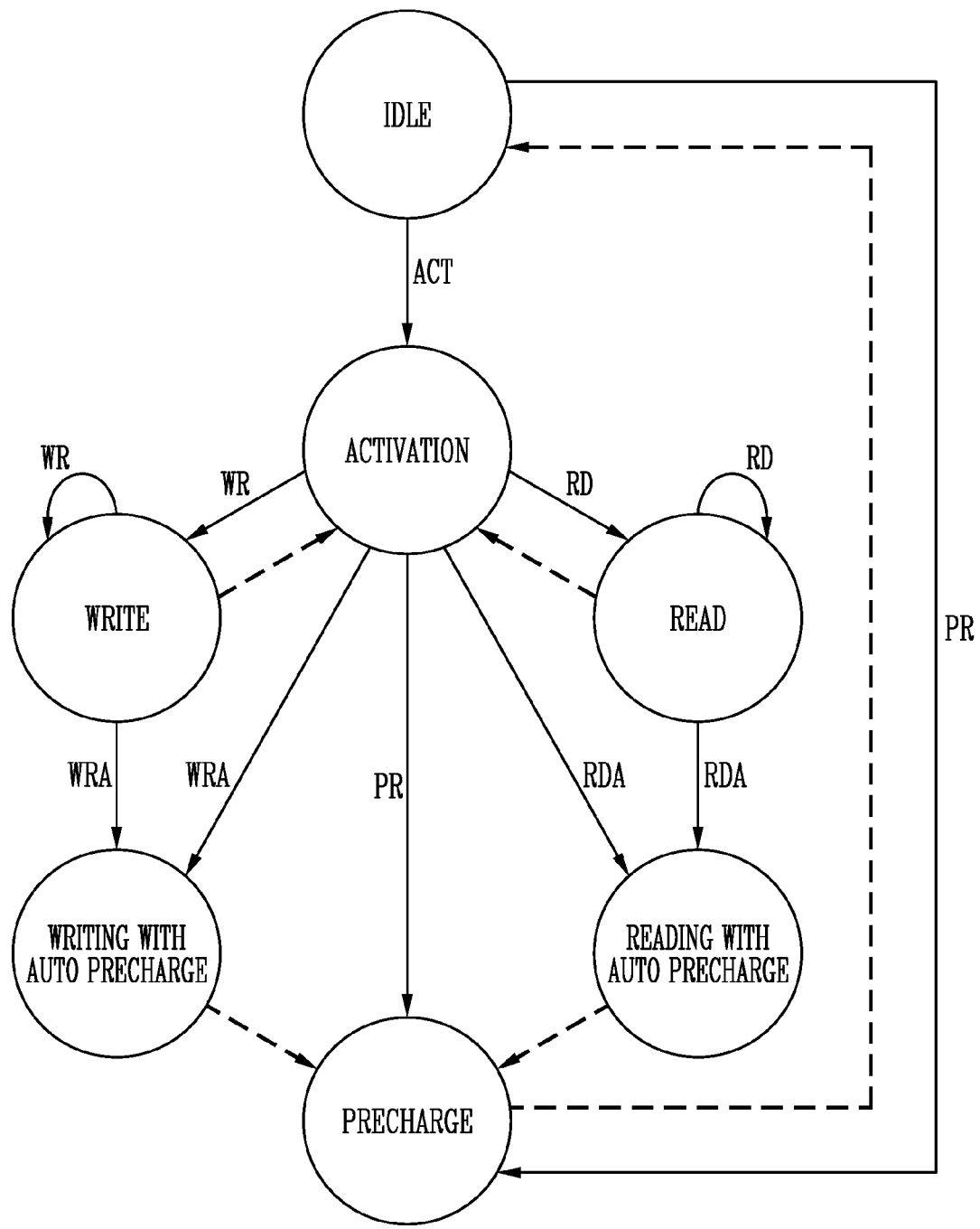
FIG. 4 is a diagram illustrating states of the volatile memory device in accordance with an embodiment of the disclosed technology.

FIG. 4 is a diagram illustrating states of the volatile memory device in accordance with an embodiment of the disclosed technology.

Referring to FIG. 4, the volatile memory device 300 may have various states. An example will be described with reference to FIG. 4. A state of the volatile memory device 300 may be any one of idle, activation, read, reading with auto precharge, write, writing with auto precharge, and precharge.

An operation changed from one state of the volatile memory device 300 to another state of the volatile memory device 300 may be triggered by a command. In addition, a minimum delay may be required before the operation is ready for responding to the command.

An arrow indicated by a solid line may represent a state transition triggered by a command provided to the volatile memory device 300. An arrow indicated by a dotted line may represent a state transition triggered automatically without a separate command. The transitions triggered by commands may follow a command sequence and the transitions triggered automatically may follow an automatic sequence.

After an initialization is performed or after a refresh operation is performed, the state of the volatile memory device 300 may be an idle state. In the idle state, the memory cell array 310 may be precharged To respond to a read command or a write command, a row in the memory cell array 310 needs to be activated. The activated row in the memory cell array 310 is also referred to as an open row.

In order to activate the row in the memory cell array 310, the control logic 360 may output an active command ACT designating the row of the memory cell array 310 to be accessed.

The state of the volatile memory device 300 may be changed from the idle state to an activation state in response to the active command ACT. A time required to activate the row, which is indicated as tRCD, is referred to as a row-column delay time, a row command to column command delay time, or a command delay time. The tRCD represents a minimum time required to latch the active command ACT in a command interface of the volatile memory device 300, program the control logic 360, read data from the row to an array of the sensing amplifiers 340, and latch data as preparation for accessing a column address designated by the row.

An operation command for designating a start column address to be accessed may be issued. The operation command may include a read command RD or a write command WR. The state of the volatile memory device 300 may be changed from the activation state to a read state in response to the read command RD. The state of the volatile memory device 300 may be changed from the activation state to a write state in response to the write command WR.

A time at which data is read from the designated column address and the open row is referred to as column address strobe latency, and is marked as a symbol tCAS. The tCAS represents a minimum time required to latch a command in the command interface, program the control circuit, and locate requested data on the memory bus.

When a specific time interval elapses without any new read command or write command, the volatile memory device 300 may automatically return to the activation state. When the open row is no longer necessary or when it is unnecessary that another row in the memory cell array 310 is to be open, the control logic 360 closes the open row by issuing a precharge command PR. The state of the volatile memory device 300 may be changed from the activation state to a precharge state in response to the precharge command PR. Subsequently, the state of the volatile memory device 300 may be changed from the precharge state to the idle state.

A read command RDA with auto precharge may be transmitted by the control logic 360. The state of the volatile memory device 300 may be first moved to a read state with auto precharge, changed to the precharge state, and then changed from the precharge state to the idle state in response to the read command RDA with auto precharge.

Alternatively, a write command WRA with auto precharge may be transmitted by the control logic 360. The state of the volatile memory device 300 may be first moved to a write state with auto precharge, changed to the precharge state, and then changed from the precharge state to the idle state in response to the write command WRA with auto precharge.

A delay time may occur in a process of precharging a corresponding row in a bank and allowing the state of the volatile memory device 300 to be changed to the idle state after data is transmitted in the read state or the write state. In addition, the delay time is designated as a bank precharge delay time or a row precharge delay time, and is marked as a symbol tRP.

A delay time for bank activation and row activation may occur so as to prepare a read operation or a write operation. This time is designated as a bank activation time, and is marked as tRAS.

The write recovery time, which is indicated as tWR, may be secured by the volatile memory device 300 to ensure that data is written to the memory cell 311 after a write operation performed in the volatile memory device 300. In some implementations, the tWR is from a time at which last data is stored in the memory cell 311 in burst writing caused by a write command to when the cell transistor Tcel is turned off by an auto precharge command. Therefore, the write recovery time needs to be secured after the write operation is completed in the volatile memory device 300 and before an auto precharge operation is performed.

Figure 5:
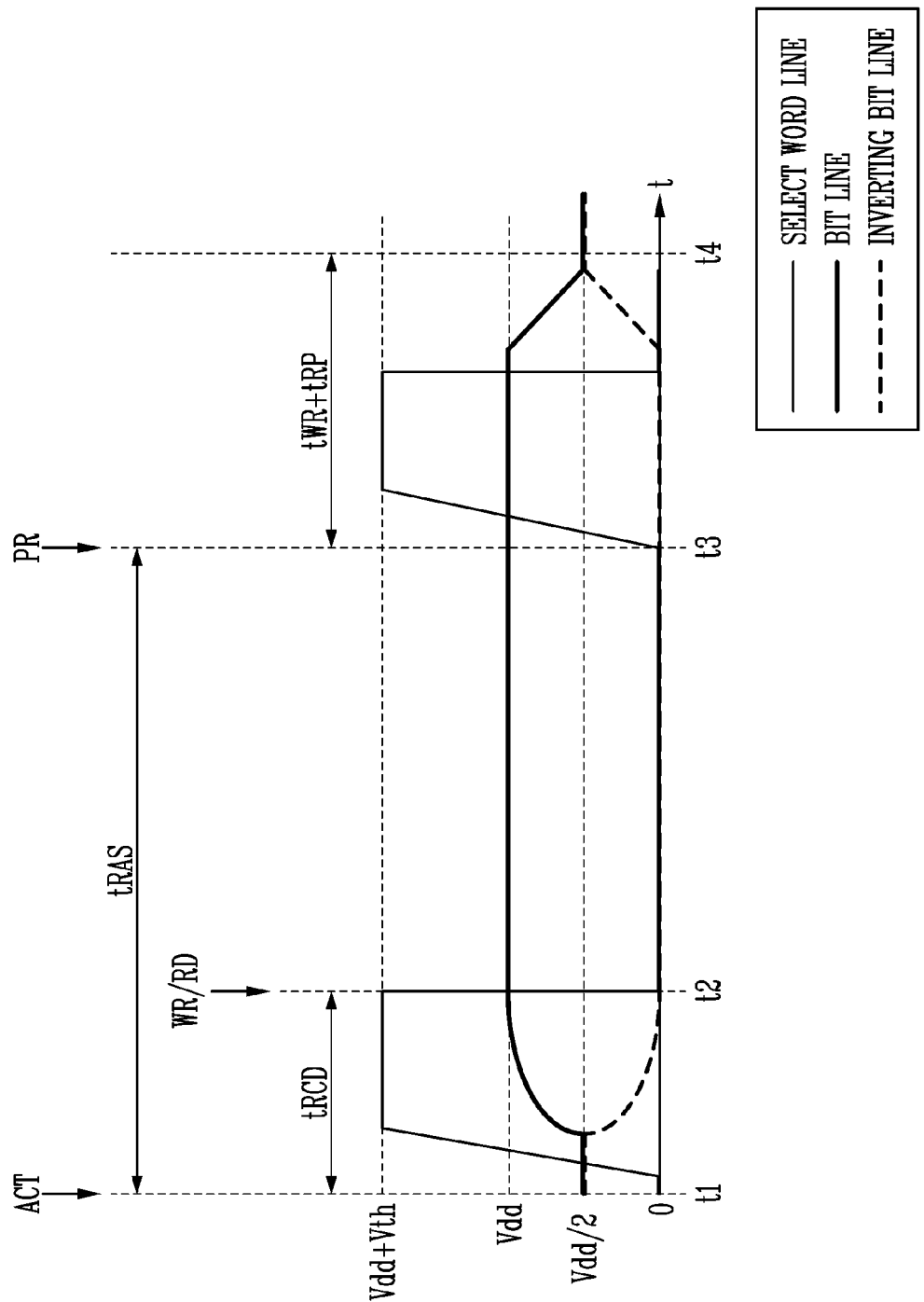
FIGS. 5 and 6 are waveform diagrams illustrating a word line voltage and a bit line voltage in accordance with embodiments of the disclosed technology.
Figure 6:
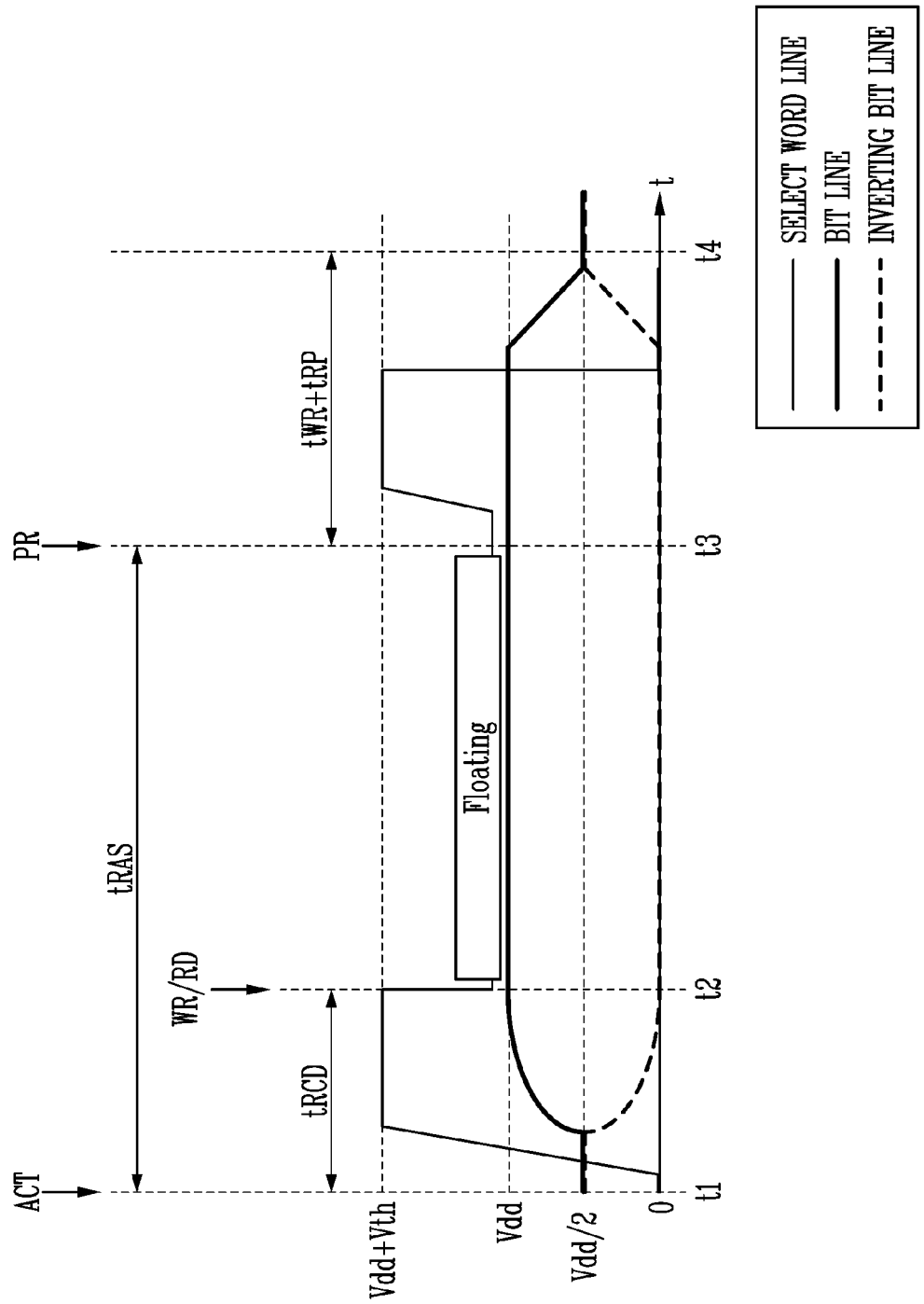

FIGS. 5 and 6 are waveform diagrams illustrating a word line voltage and a bit line voltage in accordance with embodiments of the disclosed technology.

In embodiments shown in FIGS. 5 and 6, an active period is from a time t1 to a time t3, a precharge period is from the time t3 to a time t4, and a second voltage level lower than a first voltage level is the ground voltage level (e.g., 0V). Also, in FIG. 6, it is assumed that a second voltage level lower than a first voltage level is higher than the ground voltage level (e.g., 0V).

At the time t1, the control logic 360 may provide an active command ACT to the row decoder 320. The active command ACT may be a command instructing the volatile memory device 300 to activate the row decoder 320. When the row decoder 320 is activated, a row corresponding to a select word line may be activated.

After the time t1 as a time at which the active command ACT is provided, the row decoder 320 may apply a word line voltage to the select word line. A voltage level of the word line voltage applied to the select word line may be changed from the voltage level (e.g., 0V) of the ground voltage to the first voltage level. The first voltage level may be higher than an external voltage Vdd. For example, the first voltage level may be a sum of a voltage level of the external voltage Vdd and a voltage level of a constant voltage Vth.

After the word line voltage having the first voltage level is applied to the select word line, a voltage level of a bit line voltage applied to a bit line BL may be changed from a voltage level of a reference voltage to the voltage level of the external voltage Vdd. The reference voltage may be a half (Vdd/2) of the external voltage Vdd. A voltage level of an inverting bit line voltage applied to an inverting bit line BLB may be changed from the voltage level of the reference voltage to the voltage level (e.g., 0V) of the ground voltage.

At the time t2 as a time after a command delay time tRCD elapses from the time t1, the control logic 360 may provide a write command WR or a read command RD to the column decoder 330. The column decoder 330 may select bit lines on which a read operation is to be performed and bit lines on which a write operation is to be performed among the plurality of bit lines BL. That is, memory cells on which the write operation is to be performed and memory cells on which the read operation is to be performed among the memory cells 311 connected to the select word line may be selected.

During a period corresponding to that from the time t2 to the time t3, the write operation may be performed on some memory cells among the memory cells 311 connected to the select word line. The read operation may be performed on the other memory cells among the memory cells 311 connected to the select word line.

At the time t3 as a time after a bank activation time tRAS elapses from the time t1, the control logic 360 may provide a precharge command PR to the row decoder 320 and the column decoder 330.

In order to prevent loss of data stored in the memory cell 311, it is necessary to increase the voltage level of the word line voltage applied to the select word line to the first voltage level.

After the time t3, the row decoder 320 may apply the word line voltage having the first voltage level to the select word line. The voltage level of the word line voltage applied to the select word line may be changed from the voltage level (e.g., 0V) of the ground voltage to the first voltage level. A time for which the voltage level of the word line voltage is maintained as the first voltage level may be compensated by a write recovery time tWR. That is, the word line voltage having the first voltage level may be applied to select word line during the write recovery time tWR, and then the voltage level of the word line voltage may be changed from the first voltage level to the voltage level (e.g., 0V) of the ground voltage.

After the word line voltage having the voltage level of the ground voltage is applied, the voltage level of the bit line voltage applied to the bit line BL may be changed from the voltage level of the external voltage Vdd to the voltage level of the reference voltage. The voltage level of the inverting bit line voltage applied to the inverting bit line BLB may be changed from the voltage level (e.g., 0V) of the ground voltage to the voltage level of the reference voltage.

At the t4 as a time after a sum of the write recovery time tWR and a row precharge delay time tRP elapses from the time t3, the precharge period may be ended. That is, in an embodiment, the precharge period may be a period corresponding to the sum of the write recovery time tWR and the row precharge delay time tRP.

The embodiment shown in FIG. 6 is similar to the embodiment described with reference to FIG. 5. However, unlike as shown in FIG. 5, in a period corresponding to the other time obtained by excluding the command delay time tRCD from the active period or the bank activation time tRAS, i.e., a period corresponding to that from the time t2 to the time t3, the second voltage level may be higher than the voltage level (e.g., 0V) of the ground voltage and be lower than the first voltage level. For example, the row decoder 320 may float the select word line from the time t2 as a time after the command delay time tRCD elapses from the time t1 to the time t3 as a time at which the active period or the bank activation time tRAS is ended.

As described above, characteristics of the relatively long bank activation time tRAS can be improved, a leakage current can be decreased, and IDD3N can be reduced.

Figure 7:
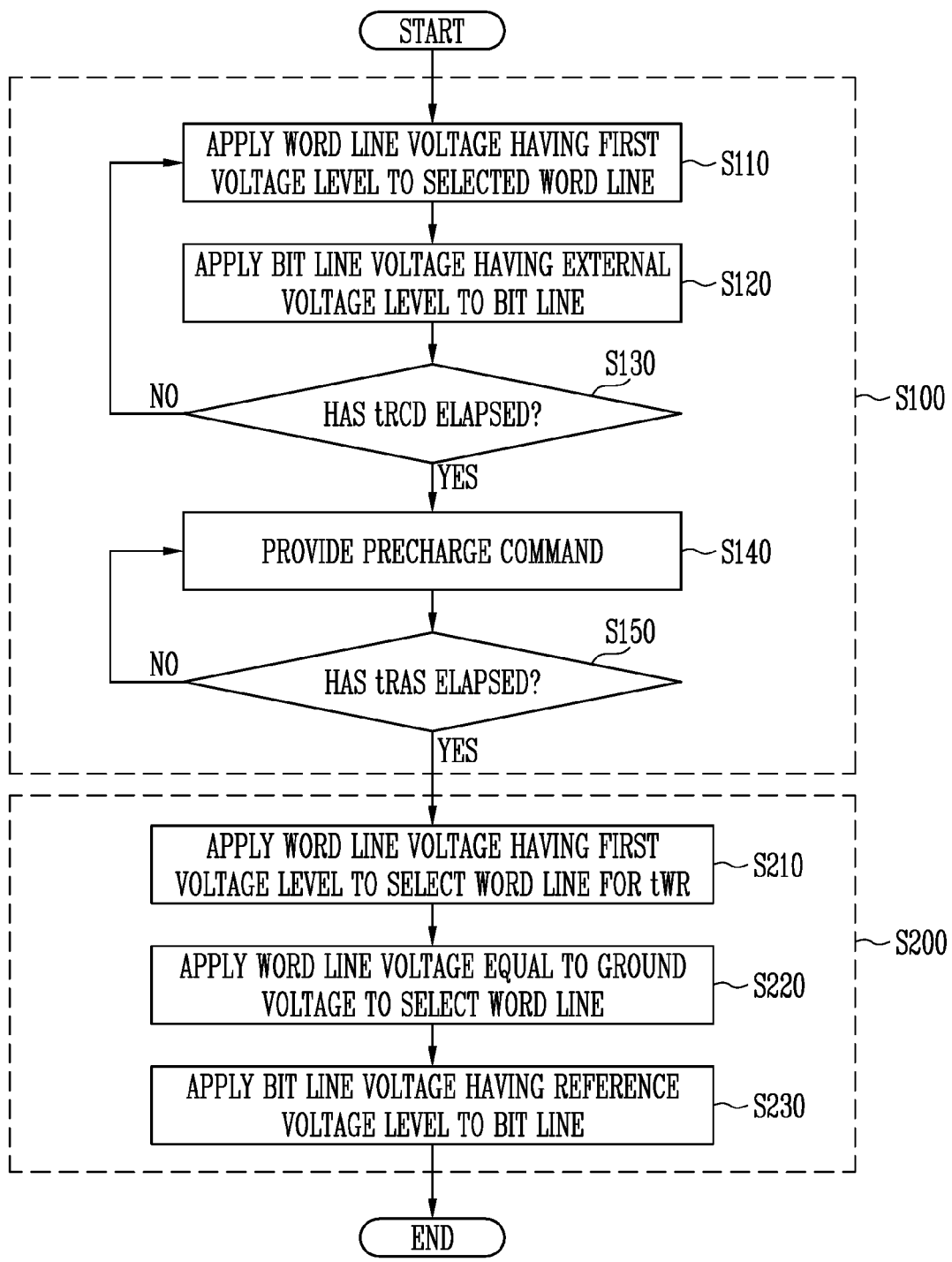
FIG. 7 is a flowchart illustrating an operating method of the volatile memory device in accordance with an embodiment of the disclosed technology.

FIG. 7 is a flowchart illustrating an operating method of the volatile memory device in accordance with an embodiment of the disclosed technology.

Referring to FIGS. 1 and 7, the operating method of the nonvolatile memory device 300 may include an active step S100 and a precharge step S200. The active step S100 may include operations performed by the volatile memory device 300 in an active period as described above. The precharge step S200 may include operations performed by the volatile memory device 300 in a precharge period occurring after the active period.

The active step S100 includes applying (step S110) a word line voltage having a first voltage level to a select word line among a plurality of word lines, applying (step S120) a bit line voltage having an external voltage level to a bit line, checking (step S130) whether a command delay time tRCD has elapsed, providing (step S140) a precharge command, and checking (step S150) whether a bank activation time tRAS has elapsed. The first voltage level may be higher than a ground voltage. For example, the first voltage level may be a sum of a voltage level of an external voltage Vdd and a voltage level of a constant voltage Vth. The external voltage level may mean the voltage level of the external voltage Vdd. A second voltage level is equal to or higher than a voltage level of the ground voltage, but may be lower than the first voltage level.

In some implementations, the row decoder 320 may apply the word line voltage having the first voltage level to the selected word line until the command delay time tRCD elapses (S110). In the column decoder 330 may apply, to the bit line, the bit line voltage increasing from a voltage level of a reference voltage to the voltage level of the external voltage Vdd (S120). When the command delay time tRCD elapses (S130, No), the row decoder 320 may apply the word line voltage having the first voltage level to the select word line until before the bank activation time tRAS elapses. When the command delay time tRCD elapses (S130, Yes), the control logic 360 may provide a precharge command PR to the row decoder 320 and the column decoder 330 (S140).

When the bank activation time tRAS elapses (S150, Yes), the precharge step S200 is performed.

The precharge step S200 includes applying (step S210) the word line voltage having the first voltage level to the select word line for a write recovery time tWR, applying (step S220) the word line voltage equal to the ground voltage to the select word line, and applying (step S230) the bit line voltage having a reference voltage level to the bit line. The reference voltage level may be the voltage level of the reference voltage, and the reference voltage may be a half (Vdd/2) of the external voltage Vdd.

In some implementations, the row decoder 320 may change the voltage level of the word line voltage from the second voltage level to the first voltage level (S210). The word line voltage having the first voltage level may be applied for the write recovery time tWR. After the word line voltage having the first voltage level is applied to the select word line, the row decoder 320 may change the voltage level of the word line voltage from the first voltage level to the voltage level of the ground voltage (S220). The column decoder 330 may apply, to the bit line, the bit line voltage decreasing from the voltage level of the external voltage Vdd to the voltage level of the reference voltage (Vdd/2) (S230).

Figure 8:
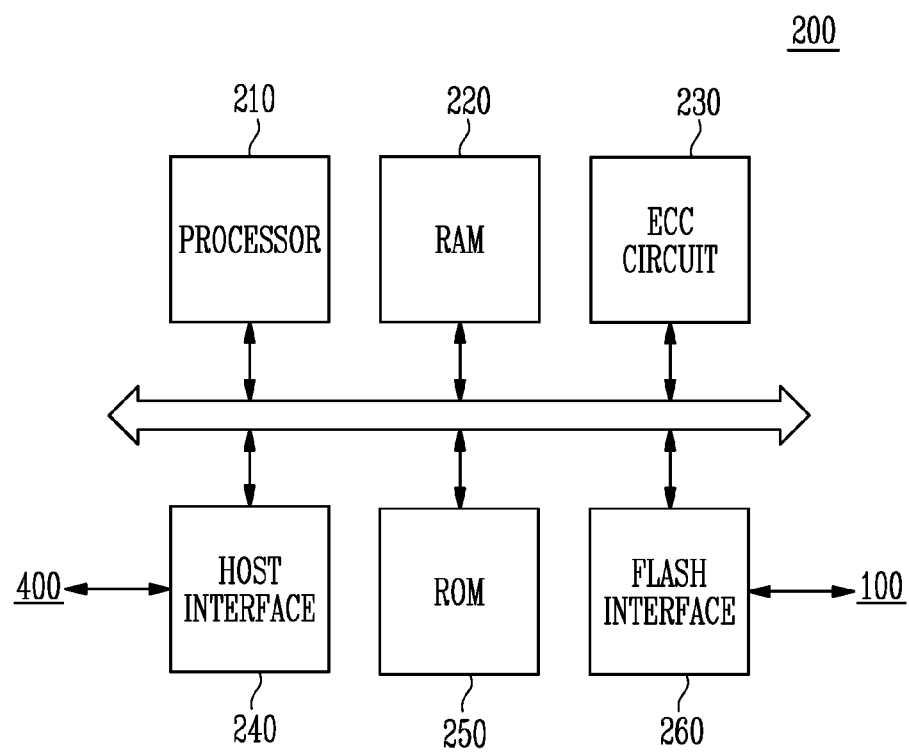
FIG. 8 is a diagram illustrating a memory controller in accordance with an embodiment of the disclosed technology.

FIG. 8 is a diagram illustrating a memory controller in accordance with an embodiment of the disclosed technology.

Referring to FIG. 8, the memory controller 200 may include a processor 210, a RAM 220, an error correction code (ECC) circuit 230, a host interface 240, a ROM 250, and a flash interface 260.

The processor 210 may control overall operations of the memory controller 200.

The RAM 220 may be used as a buffer memory, a cache memory, a working memory, etc. of the memory controller 200. Exemplarily, the RAM 220 may be a buffer memory.

The ECC circuit 230 may generate an ECC for correcting a fail bit or error bit of data received from the nonvolatile memory device 100.

The ECC circuit 230 may generate data to which a parity bit is added by performing ECC encoding of data provided to the nonvolatile memory device 100. The parity bit (not shown) may be stored in the nonvolatile memory device 100.

The ECC circuit 230 may perform ECC decoding on data output from the nonvolatile memory device 100. The ECC circuit 230 may correct an error by using a parity.

For example, the ECC circuit 230 may correct an error by using various coded modulations such as an LDPC code, a BCH code, a turbo code, a Reed-Solomon code, a convolution code, an RSC, a TCM, and a BCM.

The ECC circuit 230 may calculate an ECC value of data to be programmed to the nonvolatile memory device 100 in a program operation.

The ECC circuit 230 may perform an error correction operation on data read from the nonvolatile memory device 100 in a read operation, based on the ECC value.

The ECC circuit 230 may perform an error correction operation of data recovered from the nonvolatile memory device 100 in a recovery operation of data which fails.

The memory controller 200 may communicate with an external device (e.g., the host 400, an application processor, or the like) through the host interface 240.

The ROM 250 may store, in the form of firmware, various information required in an operation of the memory controller 200.

The memory controller 200 may communicate with the nonvolatile memory device 100 through the flash interface 260. The memory controller 200 may transmit a command CMD, an address ADDR, a control signal CTRL, and the like to the nonvolatile memory device 100 through the flash interface 260, and receive data DATA.

The flash interface 260 may include, for example, a NAND interface.

Figure 9:
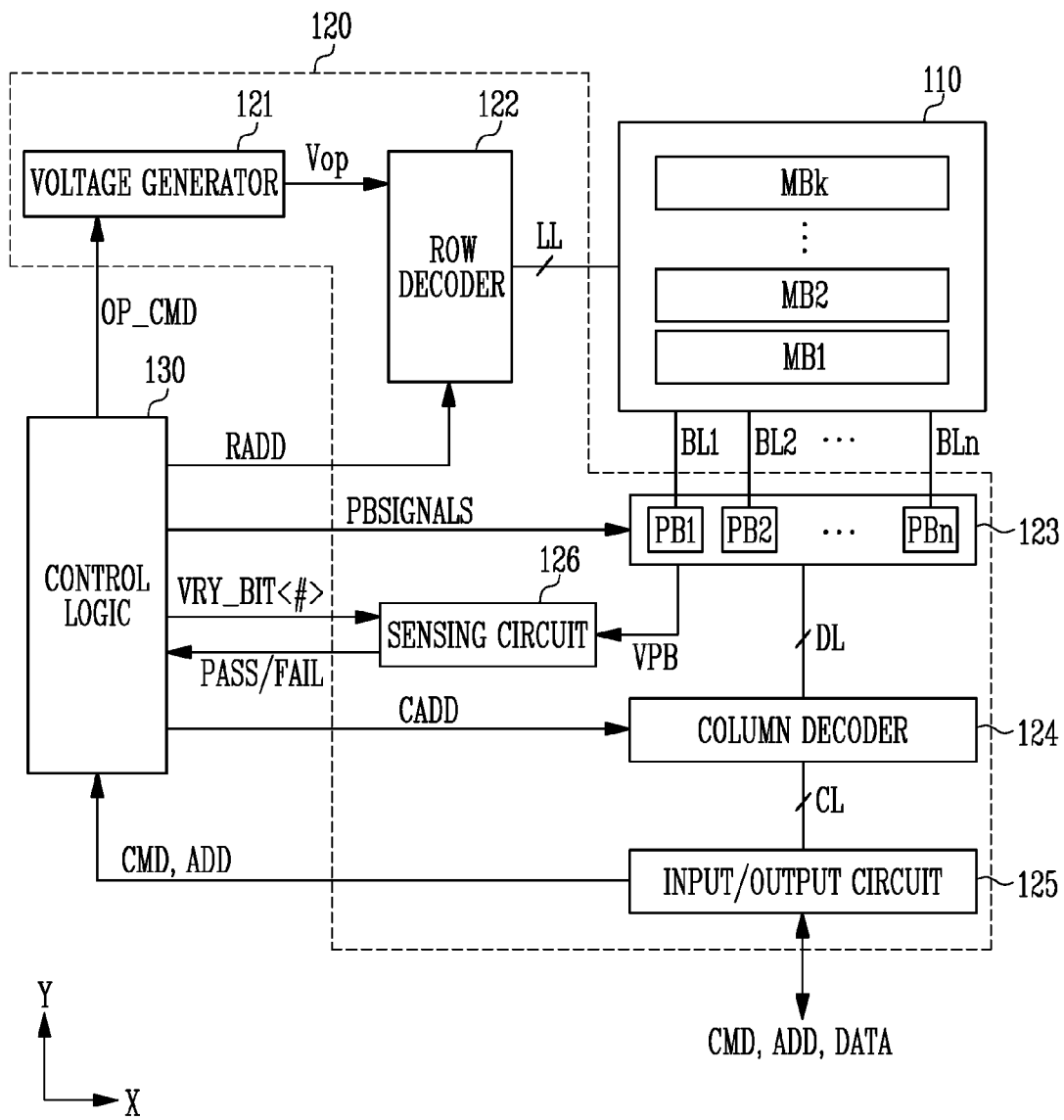
FIG. 9 is a diagram illustrating a nonvolatile memory device in accordance with an embodiment of the disclosed technology.

FIG. 9 is a diagram illustrating a nonvolatile memory device in accordance with an embodiment of the disclosed technology.

Referring to FIG. 9, the nonvolatile memory device 100 may include a memory cell array 110, a peripheral circuit 120, and a control logic 130.

The memory cell array 110 may include a plurality of memory blocks MB1 to MBk (k is a positive integer). A number of the plurality of memory blocks MB1 to MBk is merely an example for describing embodiments of the disclosed technology, and the disclosed technology is not limited thereto.

Each of the memory blocks MB1 to MBk may be connected to local lines LL and bit lines BL1 to BLn (n is a positive integer).

The local lines LL may be connected to a row decoder 122.

The local lines LL may be connected to each of the memory blocks MB1 to MBk.

Although not shown in the drawing, the local lines LL may include a first select line, a second select line, and a plurality of word lines arranged between the first select line and the second select line.

Although not shown in the drawing, the local lines LL may further include dummy lines arranged between the first select line and the word lines, dummy lines arranged between the second select line and the word lines, and pipe lines.

The bit lines BL1 to BLn may be commonly connected to the memory blocks MB1 to MBk.

The memory blocks MB1 to MBk may be implemented in a two-dimensional or three-dimensional structure.

For example, memory cells in the memory blocks MB1 to MBk having the two-dimensional structure may be arranged in a direction parallel to a substrate.

For example, memory cells in the memory blocks MB1 to MBk having the three-dimensional structure may be stacked in a direction vertical to a substrate.

The peripheral circuit 120 may include a voltage generator 121, the row decoder 122, a page buffer group 123, a column decoder 124, an input/output circuit 125, and a sensing circuit 126.

The voltage generator 121 may generate various operating voltages Vop used for a program operation, a read operation, and an erase operation in response to an operation command OP_CMD. Also, the voltage generator 121 may selectively discharge the local lines LL in response to the operation command OP_CMD. For example, the voltage generator 121 may generate a program voltage, a verify voltage, pass voltages, a turn-on voltage, a read voltage, an erase voltage, a source line voltage, a precharge voltage, a page buffer pump voltage, a core voltage or power voltage, a mirror voltage, a reference voltage, and the like under the control of the control logic 130.

In an embodiment, the voltage generator 121 may generate an internal power voltage by regulating external power voltage. The internal power voltage generated by the voltage generator 121 is used as an operating voltage of the nonvolatile memory device 100.

In an embodiment, the voltage generator 121 may generate a plurality of voltages by using the external power voltage or the internal power voltage. For example, the voltage generator 121 may include a plurality of pumping capacitors for receiving the internal power voltage, and generate a plurality of voltages by selectively activating the plurality of pumping capacitors under the control of the control logic 130. The plurality of generated voltages may be supplied to the memory cell array 110 by the row decoder 122.

The row decoder 122 may transfer the operating voltages Vop to the local lines LL in response to a row address RADD. The operating voltages Vop may be transferred to a selected memory block among the memory blocks MB1 to MBk through the local lines LL.

For example, in a program operation, the row decoder 122 may apply a program voltage to a selected word line, and apply a program pass voltage having a level lower than that of the program voltage to unselected word lines. In a program verify operation, the row decoder 122 may apply a verify voltage to the selected word line, and apply a verify pass voltage higher than the verify voltage to the unselected word lines.

In a read operation, the row decoder 122 may apply a read voltage to the selected word line, and apply a read pass voltage higher than the read voltage to the unselected word lines.

In an erase operation, the row decoder 122 may select one memory block according to a decoded address. In the erase operation, the row decoder 122 may apply a ground voltage to word lines connected to the selected memory block.

The page buffer group 123 may include first to nth page buffers PB1 to PBn. The first to nth page buffers PB1 to PBn may be connected to the memory cell array 110 respectively through first to nth bit lines BL1 to BLn. The first to nth page buffers PB1 to PBn may operate under the control of the control logic 130.

Specifically, the first to nth page buffers PB1 to PBn may operate in response to page buffer control signals PBSIGNALS. For example, the first to nth page buffers PB1 to PBn may temporarily store data received through the first to nth bit lines BL1 to BLn, or sense a voltage or current of the bit lines BL1 to BLn in a read operation or a verify operation.

In a program operation, the first to nth page buffers PB1 to PBn may provide a bit line voltage to the first to nth bit lines BL1 to BLn in response to the page buffer control signals PBSIGNALS. The bit line voltage may be, for example, a program allow voltage or a program inhibit voltage. When the program voltage is applied to the selected word line, the first to nth page buffers PB1 to PBn may receive data DATA through the column decoder 124 and the input/output circuit 125. The first to nth page buffers PB1 to PBn may temporarily store the received data DATA. The first to nth page buffers PB1 to PBn may transfer the temporarily stored data DATA to selected memory cells through the first to nth bit lines BL1 to BLn. Memory cells of a selected page are programmed according to the transferred data DATA. A memory cell connected to a bit line to which the program allow voltage (e.g., a ground voltage) is applied may have an increased threshold voltage. A threshold voltage of a memory cell connected to a bit line to which the program inhibit voltage (e.g., a power voltage) is applied may be maintained.

In a verify operation, the first to nth page buffers PB1 to PBn may sense data stored in the selected memory cells through the first to nth bit lines BL1 to BLn.

In a read operation, the first to nth page buffers PB1 to PBn may sense data DATA stored in the selected memory cells through the first to nth bit lines BL1 to BLn, and output the sensed data DATA to the input/output circuit 125 under the control of the column decoder 124.

In an erase operation, the first to nth page buffers PB1 to PBn may float the first to nth bit lines BL1 to BLn.

The column decoder 124 may transfer data between the input/output circuit 125 and the page buffer group 123 in response to a column address CADD. For example, the column decoder 124 may exchange data with the first to nth page buffers PB1 to PBn through data lines DL, or exchange data with the input/output circuit 125 through column lines CL.

The input/output circuit 125 may transfer a command CMD and an address ADD, which are transferred from the memory controller 200, to the control logic 130, or exchange data DATA to the column decoder 124.

In a read operation or a verify operation, the sensing circuit 126 may generate a reference current in response to an allow bit VRY_BIT<#>, and output a pass signal PASS or a fail signal FAIL by comparing a sensing voltage VPB received from the page buffer group 123 with a reference sensing voltage generated by the reference voltage.

The control logic 130 may control the peripheral circuit 120 by outputting the operation command OP_CMD, the row address RADD, the page buffer control signal PBSIGNALS, and the allow bit VRY_BIT<#> in response to the command CMD and the address ADD.

Figure 10:
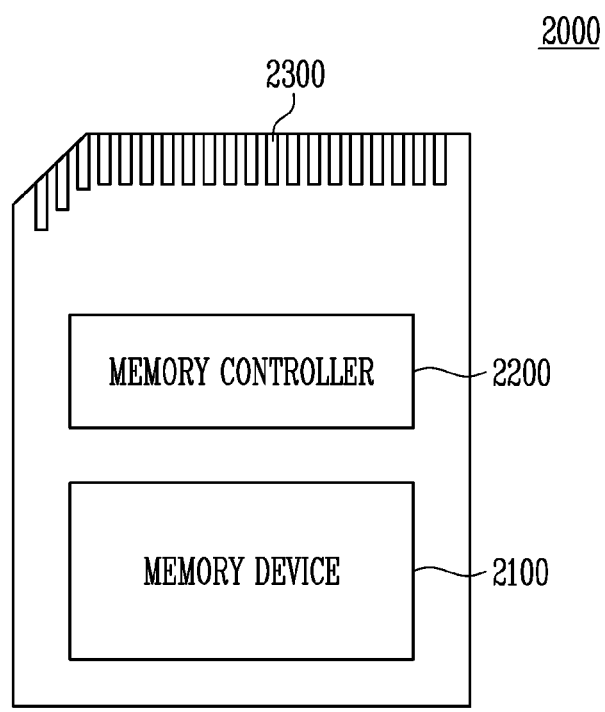
FIG. 10 is a block diagram illustrating a memory card system to which a storage device is applied in accordance with an embodiment of the disclosed technology.

FIG. 10 is a block diagram illustrating a memory card system to which the storage device is applied in accordance with an embodiment of the disclosed technology.

Referring to FIG. 10, the memory card system 2000 includes a memory device 2100, a memory controller 2200, and a connector 2300.

Exemplarily, the memory device 2100 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2200 is connected to the memory device 2100. The memory controller 2200 may access the memory device 2100. For example, the memory controller 2200 may control read, write, erase, and background operations of the memory device 2100. The memory controller 2200 provides an interface between the memory device 2100 and a host Host. The memory controller 2200 drives firmware for controlling the memory device 2100. The memory controller 2200 may be implemented identically to the memory controller 200 described with reference to FIG. 1.

Exemplarily, the memory controller 2200 may include components such as a Random Access Memory (RAM), a processing unit, a host interface, a memory interface, and an error corrector.

The memory controller 2200 may communicate with an external device through the connector 2300. The memory controller 2200 may communicate with the external device (e.g., the host 400) according to a specific communication protocol. Exemplarily, the memory controller 2200 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. Exemplarily, the connector 2300 may be defined by at least one of the above-described various communication protocols.

The memory device 2100 and the memory controller 2200 may be integrated into a single semiconductor device, to constitute a memory card. For example, the memory controller 2200 and the memory device 2100 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 11:
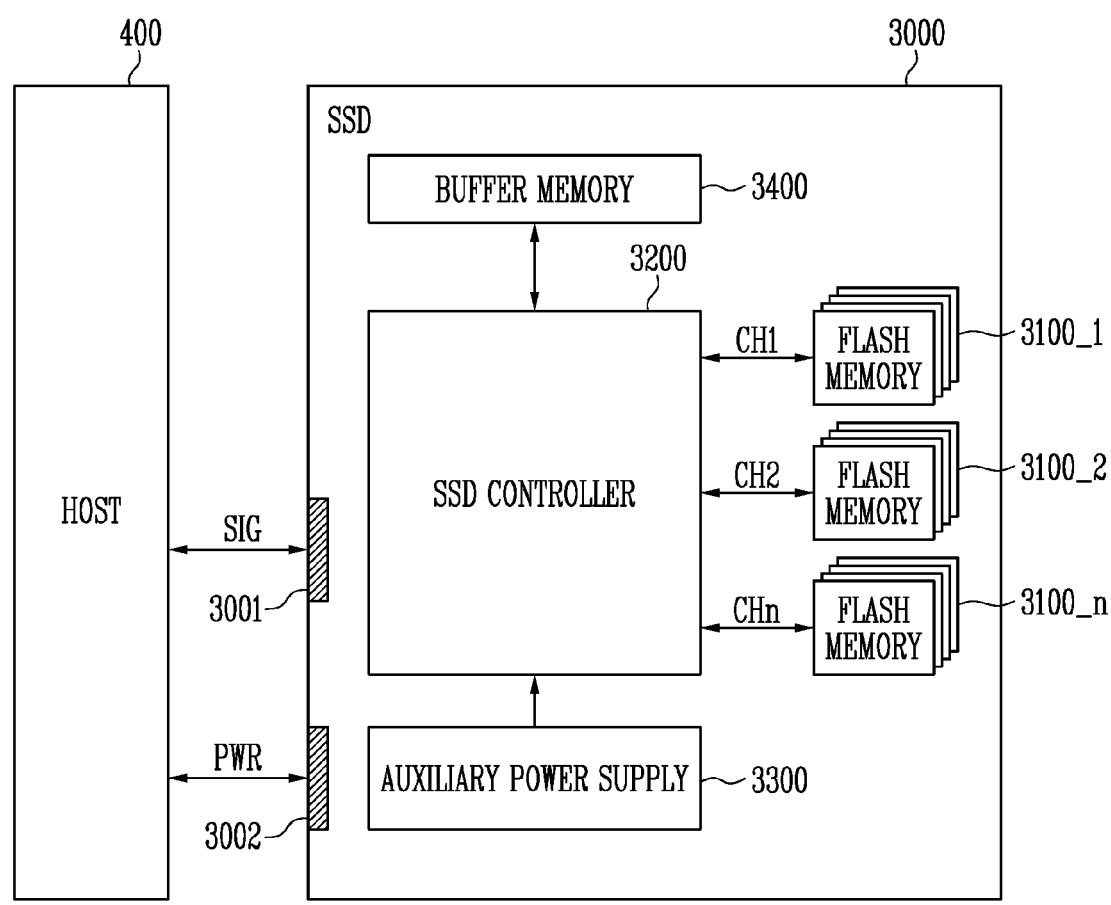
FIG. 11 is a block diagram illustrating a Solid State Drive (SSD) system to which the storage device is applied in accordance with an embodiment of the disclosed technology.

FIG. 11 is a block diagram illustrating a Solid State Drive (SSD) system to which the storage device is applied in accordance with an embodiment of the disclosed technology.

Referring to FIG. 11, the SSD system includes a host 400 and an SSD 3000.

The SSD 3000 exchanges a signal SIG with the host 400 through a signal connector 3001, and receives power PWR through a power connector 3002. The SSD 3000 includes an SSD controller 3200, a plurality of flash memories 3100_1, 3100_2, and 3100_n, an auxiliary power supply 3300, and a buffer memory 3400.

In accordance with an embodiment of the disclosed technology, the SSD controller 3200 may perform the same function as the memory controller 200 described with reference to FIG. 1.

The SSD controller 3200 may control the plurality of flash memories 3100_1, 3100_2, and 3100_n in response to a signal SIG received from the host 400. Exemplarily, the signal SIG may be a signal based on an interface between the host 400 and the SSD 3000. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3300 is connected to the host 400 through the power connector 3002. The auxiliary power device supply 3300 may receive the power PWR input from the host 400, and be charged with the power PWR. When the supply of power from the host 400 is not smooth, the auxiliary power supply 3300 may provide power of the SSD 3000. Exemplarily, the auxiliary power supply 3300 may be located in the SSD 3000, or be located at the outside of the SSD 3000. For example, the auxiliary power supply 3300 may be located on a main board, and provide auxiliary power to the SSD 3000.

The buffer memory 3400 may temporarily store data. For example, the buffer memory 3400 may temporarily store data received from the host 400 or data received from the plurality of flash memories 3100_1, 3100_2, and 3100_n, or temporarily store meta data (e.g., a mapping table) of the flash memories 3100_1, 3100_2, and 3100_n. The buffer memory 3400 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 12:
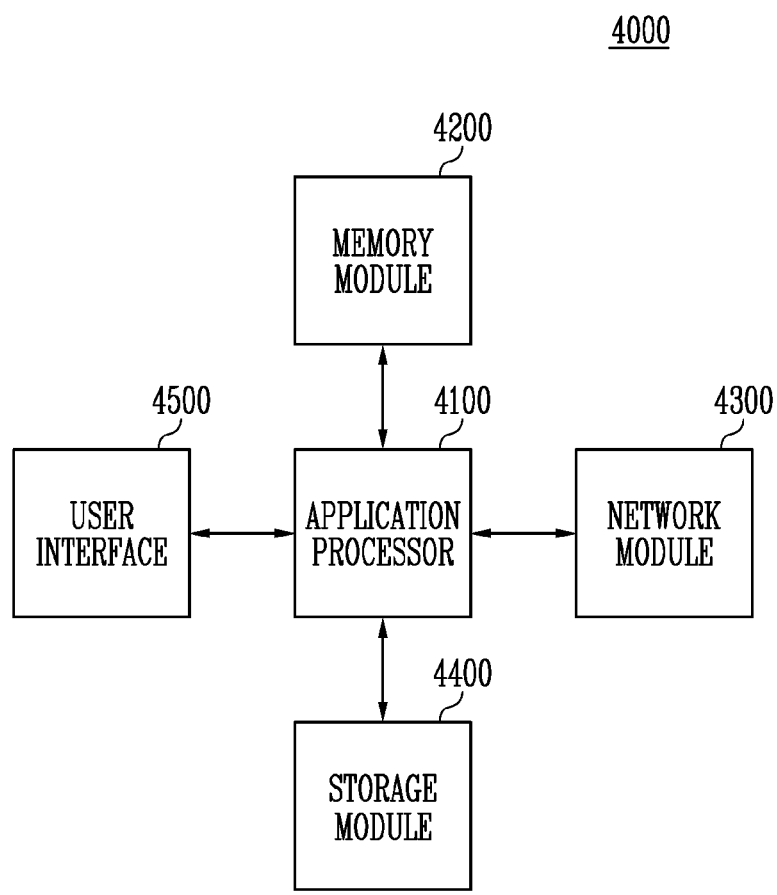
FIG. 12 is a block diagram illustrating a user system to which the storage device is applied in accordance with an embodiment of the disclosed technology.

FIG. 12 is a block diagram illustrating a user system to which the storage device is applied in accordance with an embodiment of the disclosed technology.

Referring to FIG. 12, the user system 4000 includes an application processor 4100, a memory module 4200, a network module 4300, a storage module 4400, and a user interface 4500.

The application processor 4100 may drive components included in the user system 4000, an operating system (OS), a user program, or the like. Exemplarily, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRAM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. Exemplarily, the application processor 4100 and the memory module 4200 may be provided as one semiconductor package by being packaged based on a Package on Package (PoP).

The network module 4300 may communicate with external devices. Exemplarily, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. Exemplarily, the network module 4300 may be included in the application processor 4100.

The storage module 4400 may store data. For example, the storage module 4400 may store data received from the application processor 4100. Alternatively, the storage module 4400 may transmit data stored therein to the application processor 4100. Exemplarily, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. Exemplarily, the storage module 4400 may be provided as a removable drive such as a memory card of the user system 4000 or an external drive.

Exemplarily, the storage module 4400 may operate identically to the storage device 1000 described with reference to FIG. 1. The storage module 4400 may include a plurality of nonvolatile memory devices, and the plurality of nonvolatile memory devices may operate identically to the nonvolatile memory device 100 described with reference to FIG. 1.

The user interface 4500 may include interfaces for inputting data or commands to the application processor 4100 or outputting data to an external device. Exemplarily, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the disclosed technology, there can be provided a volatile memory device, a storage device, and an operating method of a volatile memory device, which can decrease a leakage current generated in a cell capacitor and reduce IDD3N as an active standby current.

While the disclosed technology has been shown and described with reference to certain exemplary embodiments thereof, it will be understood by those skilled in the art that various changes in form and details may be made. Specifically, various modifications and enhancements of the disclosed embodiments and other embodiments can be made based on what is disclosed in this patent document.

What is claimed is:

1. A volatile memory device, comprising:
   a plurality of memory cells arranged in rows and columns and structured to store data;
   word lines coupled to the memory cells, each word line being in a row direction and coupled to memory cells in a row;
   bit lines coupled to the memory cells, each bit line being in a column direction and coupled to memory cells in a column;
   a row decoder coupled to the word lines and configured to select a word line connected to some of the plurality of memory cells;

a column decoder coupled to the bit lines and configured to select a first bit line group of the bit lines that are connected to rows of first memory cells in which data is to be stored and a second bit line group of the bit lines that are connected to second memory cells in which data has been already stored; and a control logic configured to communicate with the row and column decoders and configured to, in an active period, provide the row decoder with a first command for instructing the volatile memory device to activate the row decoder, and provide the column decoder with a second command for instructing the volatile memory device to perform an operation on the some of the plurality of memory cells, wherein the active period corresponds to a delay for bank activation that activates a bank including the some of the plurality of memory cells; wherein the row decoder is configured to apply a first word line voltage higher than a ground voltage to a selected word line, from a start of the active period when the first command is provided to when the row decoder is activated, wherein the control logic provides the second command corresponding to an activation of the row decoder, and wherein the row decoder applies a second word line voltage lower than the first word line voltage to the selected word line or floats the selected word line from when the control logic provides the second command to an end of the active period.

2. The volatile memory device of claim 1, wherein the control logic is further configured to provide, in a precharge period that is after the active period, to the row decoder and the column decoder, a precharge command instructing the volatile memory device to perform precharging of the some of the plurality of memory cells.

3. The volatile memory device of claim 2, wherein the row decoder is configured to apply the first word line voltage to the selected word line for a write recovery time that starts from when the precharge command is provided.

4. The volatile memory device of claim 3, wherein the row decoder is configured to apply the ground voltage to the selected word line during a period of time that starts from an end of the write recovery time and ends when the precharge period ends.

5. The volatile memory device of claim 3, wherein the precharge period corresponds to a sum of the write recovery time and a row precharge delay time in precharging a bit line.

6. The volatile memory device of claim 1, wherein the second word line voltage is equal to or higher than the ground voltage.

7. The volatile memory device of claim 1, wherein the selected word line is floated from when the row decoder is activated to when the active period ends.

8. A storage device, comprising:
a volatile memory device configured to temporarily store data; and
a memory controller in communication with the volatile memory device and configured to provide data, an address, and a command to the volatile memory device, wherein the volatile memory device includes:
a plurality of memory cells;
a row decoder configured to select a word line connected to some of the plurality of memory cells;
a column decoder configured to select a first bit line group connected to a first memory cell in which data is to be stored and a second bit line group connected to a second memory cell in which data has been already stored; and a control logic configured to, in an active period, provides the row decoder with a first command for instructing the volatile memory device to activate the row decoder, and provide the column decoder with a second command for instructing the volatile memory device to perform an operation on the some of the plurality of memory cells, wherein the active period corresponds to a delay for bank activation that activates a bank including the some of the plurality of memory cells, and wherein the row decoder is configured to apply, during a first period of time, a first word line voltage higher than a ground voltage to a selected word line, the first period of time starts from a start of the active period when the first command is provided and ends when the row decoder is activated; and apply, during a second period of time, a second word line voltage lower than the first word line voltage to the selected word line, the second period of time starts from when the control logic provides the second command corresponding to an activation of the row decoder and ends when the active period ends.

9. The storage device of claim 8, wherein the control logic is further configured to provide, in a precharge period that is after the active period, to the row decoder and the column decoder, a precharge command instructing the volatile memory device to perform precharging of the some of the plurality of memory cells.

10. The storage device of claim 9, wherein the row decoder is further configured to apply the first word line voltage to the selected word line for a third period of time that starts from when the precharge command is provided.

11. The storage device of claim 10, wherein the row decoder is further configured to apply the second word line voltage to the selected word line during a fourth period of time that starts from an end of the third period of time and ends when the precharge period ends.

12. The storage device of claim 10, wherein the precharge period corresponds to a sum of the third period of time and a row precharge delay time in precharging a bit line.

13. The storage device of claim 8, wherein the second word line voltage is equal to or higher than the ground voltage.

14. A method for operating a volatile memory device, the method comprising:
applying, during a first period of time in an active period, a first word line voltage higher than a ground voltage to a selected word line that is selected among a plurality of word lines coupled to memory cells included in the volatile memory device, the first period of time starting from an issuance of a first command to activate a row decoder and ending when the row decoder is activated;
providing an operation command instructing the volatile memory device to perform an operation corresponding to an activation of the row decoder;
applying, during a second period of time in the active period, a second word line voltage lower than the first word line voltage to the selected word line, the second period of time starting from when the operation command is provided to an end of the active period;
applying, in a precharge period that is after the active period, the first word line voltage to the selected word line; and applying, in the precharge period, a third word line voltage equal to the ground voltage to the selected word line.

15. The method of claim 14, wherein the precharge period corresponds to a sum of a third period of time and a row precharge delay time in precharging a bit line, the third period of time starting from an issuance of a precharge command instructing the volatile memory device to performing precharging of the some of the plurality of memory cells.

16. The method of claim 15, wherein in the applying of the first word line voltage, the first word line voltage has been changed from a second voltage level to a first voltage level.

17. The method of claim 16, wherein the second voltage level is a voltage level equal to or higher than the ground voltage.

* * * * *